United States Patent [19]

Tada

[11] Patent Number: 5,668,822
[45] Date of Patent: Sep. 16, 1997

[54] INTEGRATED SEMICONDUCTOR LASER DEVICE

[75] Inventor: Hitoshi Tada, Itami, Japan

[73] Assignee: Mitsubishi Denki Kabushiki Kaisha, Tokyo, Japan

[21] Appl. No.: 493,545

[22] Filed: Jun. 22, 1995

[30] Foreign Application Priority Data

Aug. 5, 1994 [JP] Japan ................................ 6-184732

[51] Int. Cl.$^6$ ................................................ H01S 3/04
[52] U.S. Cl. ................................. 372/36; 372/109
[58] Field of Search ....................... 372/36, 109; 257/81, 257/99

[56] References Cited

U.S. PATENT DOCUMENTS 5,022,035  6/1991  Hasegawa ............................. 372/36
5,504,349  4/1996  Yoshino ............................... 257/81

FOREIGN PATENT DOCUMENTS 2281781  4/1989  Japan .

*Primary Examiner*—James W. Davie
*Attorney, Agent, or Firm*—Leydig, Voit & Mayer, Ltd.

[57] ABSTRACT

A method of fabricating an integrated semiconductor laser device includes preparing a polygonal heat sink having side surfaces, and die-bonding semiconductor laser chips to the side surfaces of the heat sink. Therefore, the semiconductor laser chips are accurately arranged at such positions that laser beams emitted from these laser chips are parallel to each other and partially overlap each other. In addition, the semiconductor laser chips are integrated without unwanted contact of a conductive material used for the die-bonding to an active layer exposed at a facet of each laser chip. Further, since the complicated process of die-bonding a laser chip on another laser chip is dispensed with, the fabricating method is easily automated.

2 Claims, 8 Drawing Sheets

INTEGRATED SEMICONDUCTOR LASER DEVICE

FIELD OF THE INVENTION

The present invention relates to a method of fabricating integrated semiconductor laser devices that emit high-power laser light with high reproducibility. The invention also relates to integrated semiconductor laser devices that emit high-power laser light with high stability for many hours.

BACKGROUND OF THE INVENTION

In recent years, with an increase in functions of semiconductor laser devices, integrated semiconductor laser devices in which a plurality of semiconductor laser chips are stacked to produce high-power output light have been developed.

Figure 10:
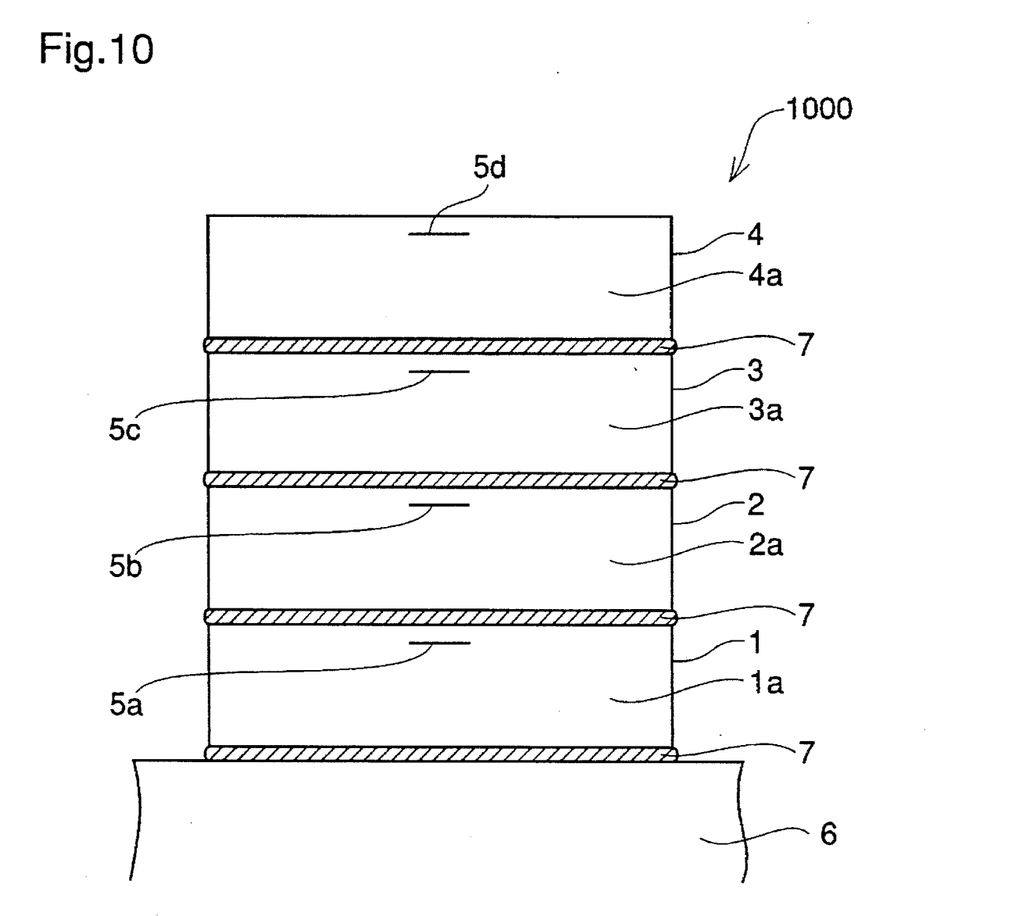
FIG. 10 is a front view illustrating an integrated semiconductor laser device according to the prior art.

FIG. 10 is a front view illustrating a conventional integrated semiconductor laser device 1000 including a heat sink 6. A first semiconductor laser chip 1 is bonded to the heat sink 6 with solder 7. Likewise, a second semiconductor laser chip 2 is bonded to the first chip 1, a third semiconductor laser chip 3 is bonded to the second chip 2, and a fourth semiconductor laser chip 4 is bonded to the third chip 3, with the solder 7. Reference numerals 5a to 5d designate light emitting regions, i.e., active layers, of the semiconductor laser chips 1 to 4, respectively. Reference numerals 1a, 2a, 3a, and 4a designate light emitting facets of the semiconductor laser chips 1, 2, 3, and 4, respectively. Laser light beams are emitted from the light emitting regions 5a to 5d in the direction perpendicular to the light emitting facets 1a to 4a of the laser chips 1 to 4, respectively, i.e., in the direction perpendicular to the paper on which FIG. 10 appears. An upper electrode (not shown) is disposed on the fourth semiconductor laser chip 4 and connected to a power supply (not shown) with wires (not shown), such as Au wires. In addition, the heat sink 6 is connected to a power supply (not shown) with wiring (not shown).

The integrated semiconductor laser device 1000 is generally employed as a light source for a laser radar, and it outputs laser light at the watt level in a pulsed operation. Usually, when a semiconductor laser chip is continuously operated, the laser chip is thermally saturated at a certain level of output power and, thereafter, the output power decreases. In the integrated semiconductor laser device 1000, since four semiconductor laser chips 1 to 4 are simultaneously operated in a pulsed operation, high-power laser light at the watt level is realized as the total laser light emitted from these laser chips 1 to 4. The integrated semiconductor laser device 1000 is provided with a condensing lens (not shown) for collecting the laser beams emitted from the respective semiconductor laser chips 1 to 4. The condensing lens is located in front of the light emitting facets of these laser chips.

The semiconductor laser chips 1 to 4 are stacked one on another through the solder 7 to make the integrated semiconductor laser device 1000 because a semiconductor laser chip is usually longer in the horizontal direction than in the vertical direction, i.e., the width is larger than the height. Therefore, the distance between adjacent light emitting regions of the laser chips is shorter in the laser chips stacked in the vertical direction than in laser chips arranged in a horizontal direction. As a result, the broadening of the light applied to the condensing lens is reduced.

Figure 11:
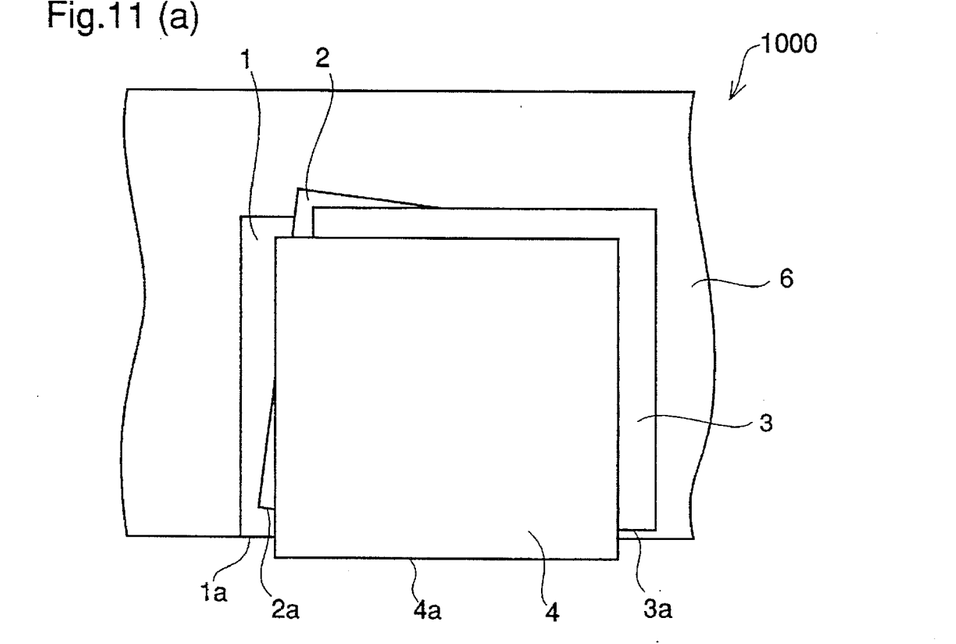
FIGS. 11(a) and 11(b) are a plan view and a front view, respectively, for explaining problems in fabrication of the prior art integrated semiconductor laser device shown in FIG. 10.

However, the prior art integrated semiconductor laser device 1000 and the method making it still have problems to be solved. FIGS. 11(a) and 11(b) are a plan view and a front view, respectively, for explaining these problems. In fabricating the integrated semiconductor laser device 1000, when the semiconductor laser chips 1 to 4 are successively stacked so that an upper electrode of a lower laser chip is soldered to a lower electrode of a higher laser chip, if a force is applied to the semiconductor laser chips in the horizontal or diagonal direction while the solder 7 is molten, the directions of the light emitting facets 1a to 4a of the laser chips 1 to 4 unfavorably vary from each other in the completed laser device 1000 as shown in FIGS. 11(a) and 11(b). Therefore, laser beams are emitted from light emitting regions 5a to 5d in different directions and the power of the laser light collected by the condensing lens is reduced.

Further, as illustrated in FIG. 11(b), during soldering of the laser chips, the molten solder 7 may flow over the side surface of the chip and contact the active layer exposed at the side surface. In this case, when the semiconductor laser device 1000 is operated, the active layer is electrically short-circuited by the solder 7, and desired laser operation is not achieved.

Since the semiconductor laser chip 1 contacts the heat sink 6, unwanted heat generated in the semiconductor laser chip 1 during operation is conducted through the heat sink 6, whereby the semiconductor laser chip 1 is cooled. However, heat generated in the laser chips above the laser chip 1 is not conducted through the heat sink 6, resulting in an excessive rise in temperature that adversely affects the performance of the laser device 1000. As a result, the lasers device 1000 cannot emit high-power laser light with high stability for many hours.

Since the semiconductor laser chip employed in the integrated semiconductor laser device 1000 is about 300 square microns in area at the front (rear) surface, successive stacking and soldering of the semiconductor laser chips are very complicated. In addition, it is difficult to automate the process. On the other hand, an apparatus for fabricating an ordinary semiconductor laser device in which a semiconductor laser chip is soldered to a heat sink plate, i.e., a mount, has already been developed and put to practical use.

SUMMARY OF THE INVENTION

It is an object of the present invention to provide a method for fabricating an integrated semiconductor laser device that emits high-power laser light with high reproducibility.

It is another object of the present invention to provide an integrated semiconductor laser device that emits high-power laser light with high stability for many hours.

It is still another object of the present invention to provide an integrated semiconductor laser device, a fabrication process for which can be automated.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a method of fabricating an integrated semiconductor laser device comprises preparing a heat sink having a shape of a polygonal pillar or a polygonal pyramid with a plurality of side surfaces, and die-bonding a plurality of semiconductor laser chips to the side surfaces of the heat sink. Therefore, the semiconductor laser chips are accurately arranged at positions such that laser beams emitted from these laser chips are parallel to each other or directed toward a point, and partially overlap each other. In addition, the semiconductor laser chips are integrated without unwanted contact of a conductive material used for die-bonding to an active layer exposed at a facet of each laser chip. Further, since the complicated process of die-bonding one laser chip to another laser chip is dispensed with, the fabrication method is easily automated.

According to a second aspect of the present invention, an integrated semiconductor laser device comprises a heat sink having a shape of a polygonal pillar or a polygonal pyramid with a plurality of side surfaces, and a plurality of semiconductor laser chips die-bonded to the side surfaces of the heat sink. Therefore, the semiconductor laser chips directly contact the heat sink, and unwanted heat generated in the laser chips is conducted through the heat sink with high efficiency. In addition, unwanted electrical short-circuiting between an active layer of each laser chip and a conductive material used for the die-bonding is avoided. As a result, the laser device operates with high stability for many hours.

According to a third aspect of the present invention, a method of fabricating an integrated semiconductor laser device comprises preparing a mount having a shape of a polygonal pillar or a polygonal pyramid with a plurality of side surfaces, and die-bonding a plurality of semiconductor laser elements, each element comprising a heat sink plate having opposite upper and lower surfaces and a semiconductor laser chip die-bonded to the upper surface of the heat sink plate, to the side surfaces of the mount with the lower surface of the heat sink plate in contact with the mount. Therefore, the semiconductor laser chips are accurately arranged at such positions that laser beams emitted from these laser chips are parallel to each other or directed toward a point, and partially overlap each other. In addition, the semiconductor laser chips are integrated without unwanted contact of a conductive material used for the die-bonding to an active layer exposed at a facet of each laser chip. Further, since the complicated process of die-bonding a laser chip on another laser chip is not necessary, the fabrication method is easily automated.

According to a fourth aspect of the present invention, an integrated semiconductor laser device comprises a mount having a shape of a polygonal pillar or a polygonal pyramid with a plurality of side surfaces, and a plurality of semiconductor laser elements each comprising a heat sink plate having opposite upper and lower surfaces and a semiconductor laser chip die-bonded to the upper surface of the heat sink plate, the laser elements being die-bonded to the side surfaces of the mount with the lower surface of the heat sink plate in contact with the mount. Therefore, the semiconductor laser chips directly contact the heat sink, and unwanted heat generated in the laser chips is conducted through the heat sink with high efficiency. In addition, unwanted short-circuiting between an active layer of each laser chip and a conductive material used for the die-bonding is avoided. As a result, the laser device operates with high stability for many hours.

According to a fifth aspect of the present invention, a method of fabricating an integrated semiconductor laser device comprises preparing a bendable thin mount having a surface, die-bonding a plurality of semiconductor laser elements to the surface of the bendable thin mount so that the laser elements are arranged along a straight line, each laser element comprising a heat sink plate having opposite upper and lower surfaces and a semiconductor laser chip die-bonded to the upper surface of the heat sink plate, and bending the thin mount at positions between adjacent semiconductor laser elements. Therefore, the semiconductor laser chips are accurately arranged at positions such that laser beams emitted from these laser chips are parallel and close to each other. In addition, the semiconductor laser chips are integrated without unwanted contact of a conductive material used for the die-bonding to in active layer exposed at a facet of each laser chip. Further, since the complicated process of die-bonding one laser chip to another laser chip is dispensed with, the fabrication method is easily automated.

According to a sixth aspect of the present invention, an integrated semiconductor laser device comprises a bendable thin mount having a surface, and a plurality of semiconductor laser elements die-bonded to the surface of the bendable thin mount so that the laser elements are arranged along a straight line, each laser element comprising a heat sink plate having opposite upper and lower surfaces and a semiconductor laser chip die-bonded to the upper surface of the heat sink plate. The thin mount is bent at positions between adjacent semiconductor laser elements. Therefore, the semiconductor laser chips directly contact the heat sink, and unwanted heat generated in the laser chips is conducted through the heat sink with high efficiency. In addition, unwanted short-circuiting between an active layer of the laser chip and a conductive material used for the die-bonding is avoided. As a result, the laser device operates with high stability for many hours.

According to a seventh aspect of the present invention, in the method of fabricating an integrated semiconductor device, the thin mount is bent to form the shape of a polygonal pillar. Therefore, the semiconductor laser chips are accurately arranged at positions such that laser beams emitted from these laser chips are parallel to each other and partially overlap each other.

According to an eighth aspect of the present invention, an integrated semiconductor laser device comprises a thin mount that is bent to form a shape of a polygonal pillar having a plurality of side surfaces, and a plurality of semiconductor laser elements die-bonded to the side surfaces of the thin mount, each laser element comprising a heat sink plate having opposite upper and lower surfaces and a semiconductor laser chip die-bonded to the upper surface of the heat sink plate. Therefore, the semiconductor laser chips directly contact the heat sink, and unwanted heat generated in the laser chips is conducted through the heat sink with high efficiency. In addition, unwanted electrical short-circuiting between an active layer of each laser chip and a conductive material used for die-bonding is avoided. As a result, the laser device operates with high stability for many hours.

According to a ninth aspect of the present invention, in the method of fabricating an integrated semiconductor device, the thin mount is bent to form, in side view, a bellows, i.e., sawtooth, shape. Therefore, the semiconductor laser chips are arranged at positions such that the light emitting regions of the respective laser chips are in a line and laser beams emitted from the light emitting regions are parallel and close to each other.

According to a tenth aspect of the present invention, an integrated semiconductor laser device comprises a thin mount that is bent to form, in side view, a bellows, i.e., sawtooth, shape, and a plurality of semiconductor laser elements die-bonded to the bellows-shaped mount, each laser element comprising a heat sink plate having opposite upper and lower surfaces and a semiconductor laser chip die-bonded to the upper surface of the heat sink plate. Therefore, the semiconductor laser chips directly contact the heat sink, and unwanted heat generated in the laser chips is conducted through the heat sink with high efficiency. In addition, unwanted electrical short-circuiting between an active layer of each laser chip and a conductive material used for die-bonding is avoided. As a result, the laser device operates with high stability for many hours.

According to an eleventh aspect of the present invention, a method of fabricating an integrated semiconductor laser device comprises preparing a bendable thin metal mount having opposite upper and lower surfaces, die-bonding a plurality of semiconductor laser chips to the upper surface of the bendable thin metal mount so that the laser chips are arranged along a straight line, bending the thin metal mount at positions between adjacent semiconductor laser chips, preparing a heat sink having a shape that fits the lower surface of the bent metal mount, and adhering the lower surface of the bent metal mount to the surface of the heat sink. Therefore, the semiconductor laser chips are accurately arranged at positions such that laser beams emitted from these laser chips are parallel and close to each other. In addition, the semiconductor laser chips are integrated without unwanted contact of a conductive material used for the die-bonding to an active layer exposed at a facet of each laser chip. Further, since the complicated process of die-bonding one laser chip on another laser chip is dispensed with, the fabrication method is easily automated.

According to a twelfth aspect of the present invention, an integrated semiconductor laser device comprises a plurality of semiconductor laser chips, a thin metal mount having opposite upper and lower surfaces, on which upper surface the semiconductor laser chips are die-bonded along a straight line, which thin metal mount is bent at positions between adjacent semiconductor laser chips, and a heat sink having a shape that fits the lower surface of the bent metal mount and is adhered to the lower surface of the bent metal mount. Therefore, heat generated in the semiconductor laser chips is conducted through the thin metal mount and the heat sink with high efficiency. In addition, unwanted electrical short-circuiting between an active layer of each laser chip and a conductive material used for die-bonding is avoided. As a result, the laser device operates with high stability for many hours.

According to a thirteenth aspect of the present invention, the method of fabricating an integrated semiconductor device further includes preparing a polygonal pillar-shaped heat sink having side surfaces, and winding the thin metal mount around the side surfaces of the polygonal pillar-shaped heat sink with the lower surface in contact with the heat sink so that a semiconductor laser chip is located on each side surface of the heat sink, thereby to adhere the lower surface of the thin metal mount to the heat sink. Therefore, the semiconductor laser chips are arranged at such positions that laser beams emitted from the laser chips are parallel to each other and partially overlap each other. In addition, the lower surface of the thin metal mount is easily adhered to the side surfaces of the polygonal pillar-shaped heat sink.

According to a fourteenth aspect of the present invention, an integrated semiconductor laser device comprises a polygonal pillar-shaped heat sink having side surfaces, a thin metal mount having opposite upper and lower surfaces and wound around the side surfaces of the polygonal pillar-shaped heat sink with the lower surface in contact with the heat sink, and a plurality of semiconductor laser chips die-bonded to the upper surface of the thin metal mount so that a laser chip is located on each side surface of the polygonal pillar-shaped heat sink. Therefore, heat generated in the semiconductor laser chips is conducted through the thin metal mount and the heat sink with high efficiency. In addition, unwanted electrical short-circuiting between an active layer of each laser chip and a conductive material used for the die-bonding is avoided. As a result, the laser device operates with high stability for many hours.

DETAILED DESCRIPTION OF THE PREFERRED EMBODIMENTS

Embodiment 1

Figure 1:
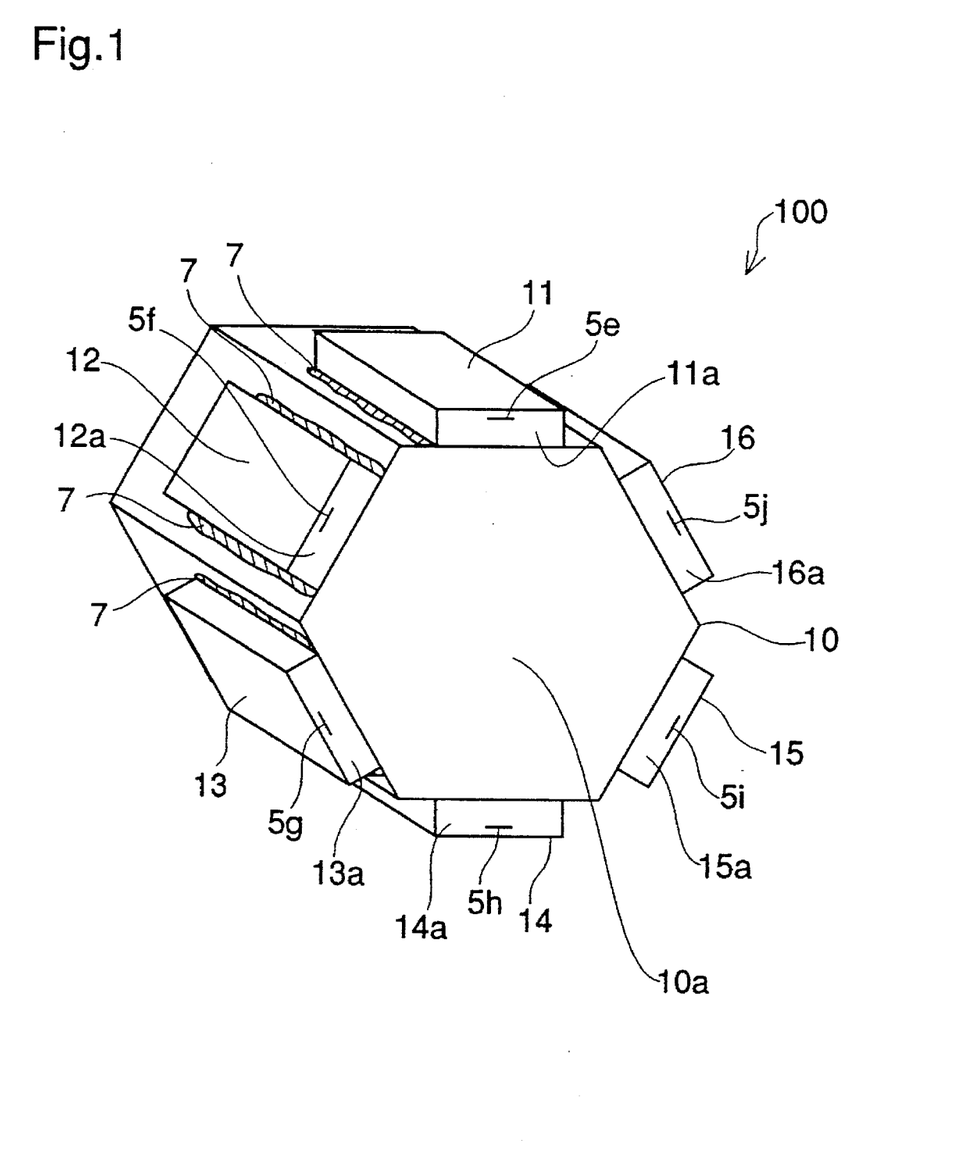
FIG. 1 is a perspective view illustrating an integrated semiconductor laser device in accordance with a first embodiment of the present invention.

FIG. 1 is a perspective view illustrating an integrated semiconductor laser device in accordance with a first embodiment of the invention. In the figure, the same reference numerals as in FIG. 10 designate the same or corresponding parts. An integrated semiconductor laser device 100 comprises a regular hexagonal pillar-shaped heat sink 10 comprising a metal having a high heat conductivity, such as Au or Cu, and first to sixth semiconductor laser chips 11, 12, 13, 14, 15, and 16 die-bonded to respective side surfaces of the heat sink 10 with solder 7. The semiconductor laser chips 11, 12, 13, 14, 15, and 16 include light emitting facets 11a, 12a, 13a, 14a, 15a, and 16a and light emitting regions, i.e., active layers, 5e, 5f, 5g, 5h, 5i, and 5j exposed at the light emitting facets, respectively. These semiconductor laser chips 11 to 16 emit laser light beams in the direction perpendicular to the respective light emitting facets 11a to 16a. The semiconductor laser chips 11 to 16 are soldered to the heat sink 10 at such positions that the light emitting facets 11a to 16a are parallel to a hexagonal front surface 10a of the heat sink 10. Further, wires (not shown), such as Au wires, are bonded to upper electrodes (not shown) of the respective semiconductor laser chips 11 to 16, and the upper electrodes are connected to a power supply through the wires. A condensing lens (not shown) for collecting light beams emitted from the laser chips 11 to 16 is disposed in front of the laser device 100.

The operation of the integrated semiconductor laser device 100 according to this first embodiment is fundamentally identical to the operation of the prior art device 1000. However, in the laser device 100, since current is directly injected into the laser chips 11 to 16 with no intermediate laser chips, the laser chips 11 to 16 oscillate simultaneously. A plurality of laser beams emitted from the respective semiconductor laser chips 11 to 16 are parallel to each other and partially overlap each other with the center point of the front surface 10a of the heat sink 10 as the center of the overlap. Therefore, the broadening of light beams applied to the condensing lens is reduced as compared to that of a laser device in which six laser chips are arranged in the horizontal direction, so that the laser light output from the condensing lens has a high power.

The semiconductor laser chips 11 to 16 are die-bonded, one by one, to the six side surfaces of the regular hexagonal pillar-shaped heat sink with solder 7. This soldering is carried out so that the light emitting facets 11a to 16a of the respective laser chips 11 to 16 are parallel to the hexagonal front surface 10a of the heat sink 10. In contrast to the prior art device shown in FIG. 10, no laser chip is bonded to the upper surface, i.e., upper electrode, of a laser chip already soldered to the heat sink 10. Therefore, each laser chip is accurately positioned with the light emitting facet parallel to the front surface 10a of the heat sink 10. Further, since the semiconductor laser chips are not soldered one upon another, the solder 7 does not contact the active layers exposed at the facets of the respective laser chips.

In the fabrication process, the semiconductor laser chips 11 to 16 are arranged with high accuracy at positions such that the laser beams emitted from the respective laser chips are parallel to each other and partially overlap each other. Further, the semiconductor laser chips 11 to 16 are integrated without unwanted contact of the solder 7 and the active layers exposed at the facets of the laser chips. As a result, the integrated semiconductor laser device 100 that emits high-power laser light is fabricated with high reproducibility and fabrication efficiency is significantly improved. Further, because the soldering of the semiconductor laser chips on the six side surfaces of the regular hexagonal pillar-shaped heat sink 10 is substantially identical to conventional soldering of semiconductor laser chips on a heat sink plate, the soldering process according to this first embodiment is easily automated.

In the integrated semiconductor laser device 100 according to the first embodiment of the invention, since the semiconductor laser chips 11 to 16 directly contact the heat sink 10, unwanted heat generated in the laser chips is conducted through the heat sink 10 with high efficiency. In the prior art integrated semiconductor laser device 1000 in which the semiconductor laser chips are stacked, the heat from the upper laser chip is harder to remove through the heat sink 6, i.e., the upper laser chip is harder to cool, resulting in an excessive rise in temperature that adversely affects the performance of the laser device. However, the problem in the prior art device is prevented in the device according to the first embodiment of the invention.

Furthermore, since the solder 7 used in the die-bonding process does not contact the active layers exposed at the facets of the respective semiconductor laser chips 11 to 16, short-circuiting between the solder 7 and the active layers during laser operation is avoided, whereby the semiconductor laser chips 11 to 16 perform desired laser oscillation with high stability for many hours. As a result, the integrated semiconductor laser device 100 continuously outputs high-power light with high stability for many hours.

Figure 12:
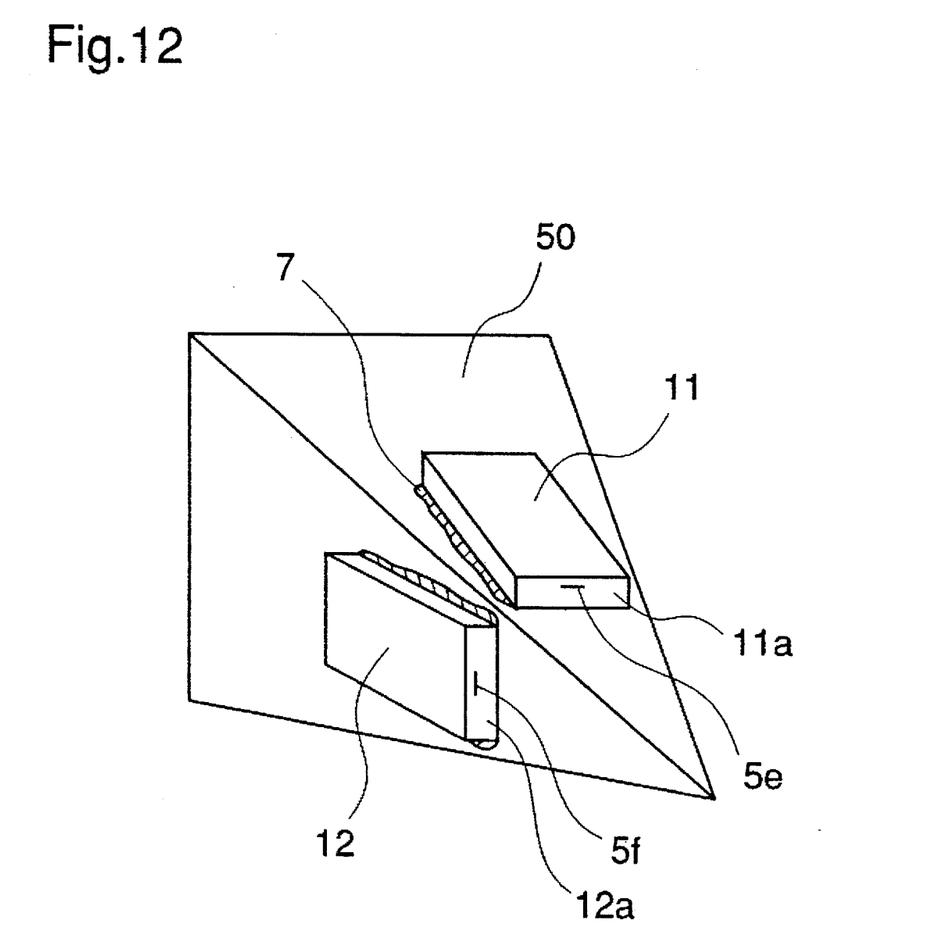
FIG. 12 is a perspective view illustrating an integrated semiconductor laser device in accordance with a modification of the first embodiment of the present invention.

While in the first embodiment a regular hexagonal pillar-shaped heat sink is employed, the heat sink is not restricted to that shape. For example, a pillar-shaped heat sink having a bottom surface that is a regular polygon or a polygon with edge lengths almost equal to each other and a plurality of side surfaces on which respective semiconductor laser chips are mounted may be employed. Also in this case, when the semiconductor laser chips are soldered to the side surfaces of the heat sink one by one, an integrated semiconductor laser device in which laser beams emitted from the semiconductor laser chips are parallel to each other and partially overlap each other is realized, so that the same effects as in the first embodiment are achieved. Alternatively, as shown in FIG. 12, a pyramidal heat sink having a bottom surface that is a regular polygon or a polygon with edge lengths almost equal to each other and a plurality of side surfaces on which respective semiconductor laser chips are mounted may be employed. Also in this case, when the semiconductor laser chips are soldered to the side surfaces of the heat sink one by one, an integrated semiconductor laser device in which laser beams emitted from the semiconductor laser chips are concentrated on a point and partially overlap each other is realized, so that the same effects as in the first embodiment are achieved.

Embodiment 2

Figure 2:
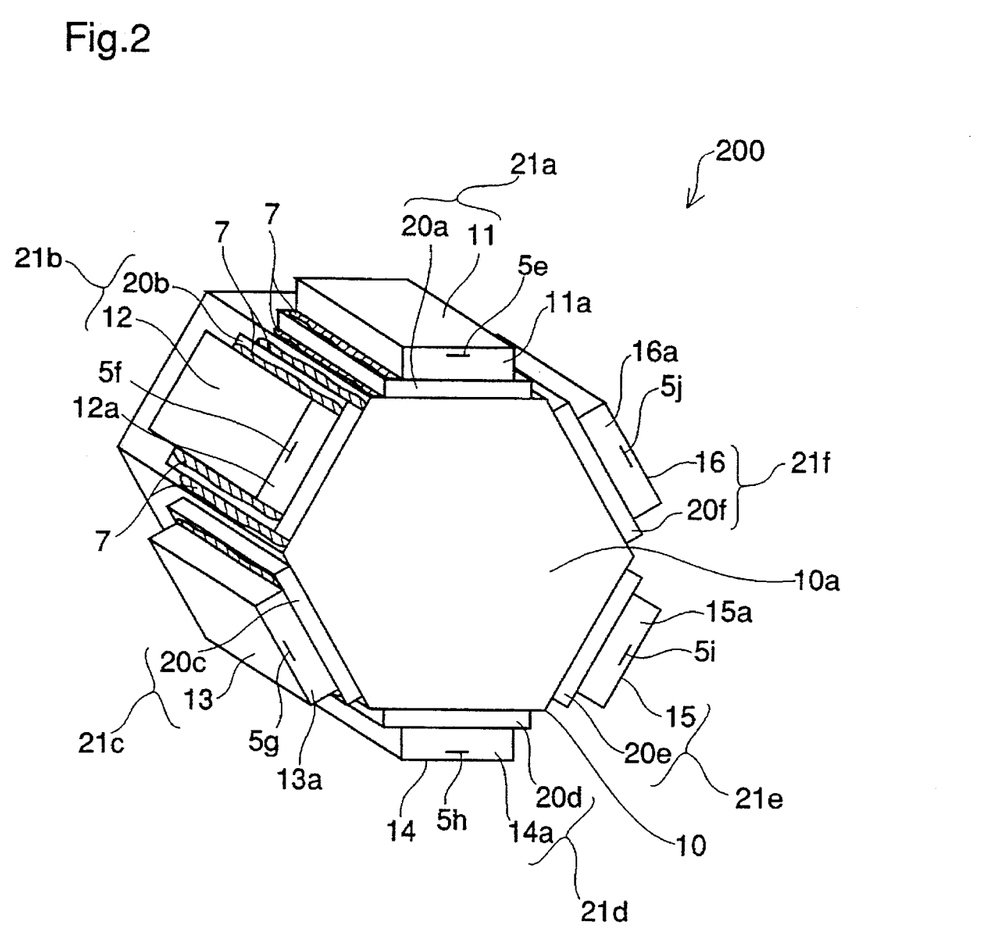
FIG. 2 is a perspective view illustrating an integrated semiconductor laser device in accordance with a second embodiment of the present invention.

FIG. 2 is a perspective view illustrating an integrated semiconductor laser device 200 in accordance with a second embodiment of the present invention. In FIG. 2, the same reference numerals as in FIG. 1 designate the same or corresponding parts. The integrated semiconductor laser device 200 comprises a regular hexagonal pillar-shaped heat sink 10 comprising a metal having a high heat conductivity, such as Au or Cu, and six semiconductor laser elements 21a to 21f bonded, one by one, to the six side surfaces of the heat sink 10 with solder 7. Reference numerals 20a to 20f designate heat sink plates.

The semiconductor laser elements 21a to 21f are obtained by soldering the semiconductor laser chips 11 to 16 to the heat sink plates 20a to 20f, respectively, at such positions that the light emitting facet of each laser chip is parallel to a side surface of each heat sink plate. Further, the semiconductor laser elements 21a to 21f are soldered to the heat sink 10 at such positions that each facet of the laser chip is parallel to the hexagonal front surface 10a of the heat sink 10. As in the first embodiment of the invention, wires (not shown), such as Au wires, are bonded to upper electrodes (not shown) of the respective semiconductor laser chips 11 to 16, and the upper electrodes are connected to a power supply through the wires. A condensing lens (not shown) for collecting light beams emitted from the respective laser chips 11 to 16 is located in front of the laser device 200.

The operation of the integrated semiconductor laser device 200 according to the second embodiment is fundamentally identical to the operation of the device 100 according to the first embodiment except that heat generated in the laser chips 11 to 16 during operation is conducted through the heat sink plates 20a to 20f bonded to the laser chips 11 to 16, respectively, and to the regular hexagonal pillar-shaped heat sink 10.

In fabrication of the integrated semiconductor laser device 200, initially, a plurality of semiconductor laser elements 21a to 21f, each comprising a heat sink plate and a semiconductor laser chip soldered to the heat sink, are prepared and, thereafter, these semiconductor laser elements are soldered, one by one, to the side surfaces of the regular hexagonal pillar-shaped heat sink 10. Therefore, as in the first embodiment, the semiconductor laser elements 21a to 21f are accurately arranged on the heat sink 10 at positions such that the laser beams emitted from the laser chips 11 to 16 are parallel to each other and partially overlap each other. As a result, the integrated semiconductor laser device 200 emitting high-power output light is fabricated with high reproducibility and fabricating efficiency is significantly improved. In addition, because the soldering of the semiconductor laser elements 21a to 21f to the side surfaces of the regular hexagonal pillar-shaped heat sink 10 is very easy, the fabrication process is easily automated.

In the integrated semiconductor laser device 200 according to this second embodiment of the invention, since the semiconductor laser chips 11 to 16 are provided with the heat sinks 20a to 20f, respectively, unwanted heat generated in the semiconductor laser chips during the operation of the laser device is conducted through the respective heat sinks with high efficiency. In addition, since the solder 7 does not contact the active layers exposed at the facets of the laser chips, unwanted short-circuiting between the solder 7 and the active layers is avoided. Therefore, the integrated semiconductor laser device 200 continuously emits high-power laser light with high stability for many hours.

While in the first embodiment a regular hexagonal pillar-shaped heat sink is employed, the heat sink is not restricted to a hexagonal shape. For example, a pillar-shaped or pyramidal heat sink having a bottom surface that is a regular polygon or a polygon with edge lengths almost equal to each other and a plurality of side surfaces on which respective semiconductor laser elements are mounted may be employed. Also in this case, when the semiconductor laser elements are soldered to the side surfaces of the heat sink one by one, an integrated semiconductor laser device in which laser beams emitted from the semiconductor laser chips are parallel to each other (in case of the pillar-shaped heat sink) or concentrated on a point (in case of the pyramidal heat sink) and partially overlap each other is realized, so that the same effects as in the second embodiment are achieved.

Alternatively, in place of the heat sink 10, a pillar-shaped or pyramidal insulating mount having a bottom surface that is a regular polygon or a polygon with edge lengths almost equal to each other and a plurality of side surfaces on which respective semiconductor laser chips are mounted may be employed. In this case, when the semiconductor laser elements are soldered to the side surfaces of the insulating mount and the heat sinks of the respective semiconductor laser elements are connected to a power supply with wires, an integrated semiconductor laser device in which laser beams emitted from the semiconductor laser chips are parallel to each other (in case of the pillar-shaped mount) or concentrated on a point (in case of the pyramidal mount) and partially overlap each other is realized, so that the same effects as in the second embodiment are achieved.

Embodiment 3

Figure 3:
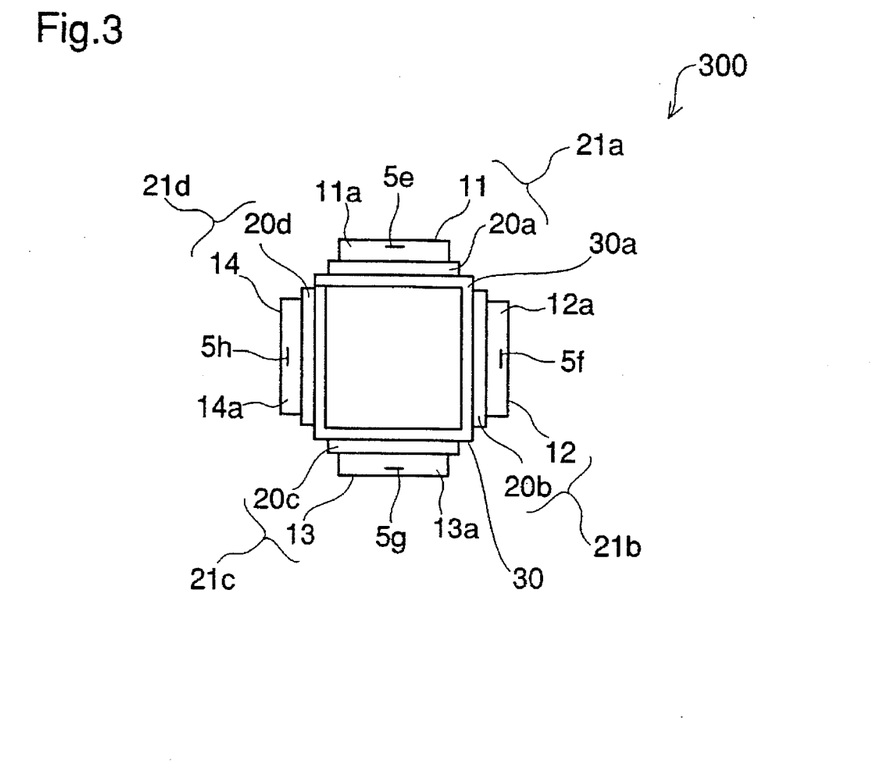
FIG. 3 is a front view of an integrated semiconductor laser device in accordance with a third embodiment of the present invention.

FIG. 3 is a diagram illustrating an integrated semiconductor laser device in accordance with a third embodiment of the present invention. In FIG. 3, the same reference numerals as in FIG. 2 designate the same or corresponding parts. An integrated semiconductor laser device 300 comprises a printed substrate 30 and a plurality of semiconductor laser elements 21a to 21d soldered to the printed substrate 30. The printed substrate 30 is obtained by bending an oblong printed plate having an upper surface with wiring (not shown) in a shape of four sides of a cube with the upper surface outward. The semiconductor laser elements 21a to 21d are soldered to the four sides of the square pillar-shaped substrate 30, respectively. The semiconductor laser elements 21a to 21d are obtained by soldering semiconductor laser chips 11 to 14 to heat sink plates 20a to 20d, respectively. The soldering is carried out so that light emitting facets 11a, 12a, 13a, and 14a of the respective semiconductor laser chips 11, 12, 13, and 14 are parallel to a side surface 30a of the printed substrate 30. In addition, wires (not shown), such as Au wires, are bonded to upper electrodes (not shown) of the semiconductor laser chips 11 to 14, and these upper electrodes are connected to a power supply with the wires. In FIG. 3, solder used for die-bonding is not shown.

The operation of the integrated semiconductor laser device 300 is fundamentally identical to the operation of the integrated semiconductor laser device 200 according to the second embodiment. In addition, unwanted heat generated in the semiconductor laser chips 11 to 14 during operation is conducted through the heat sinks 20a to 20d, respectively.

Figure 4:
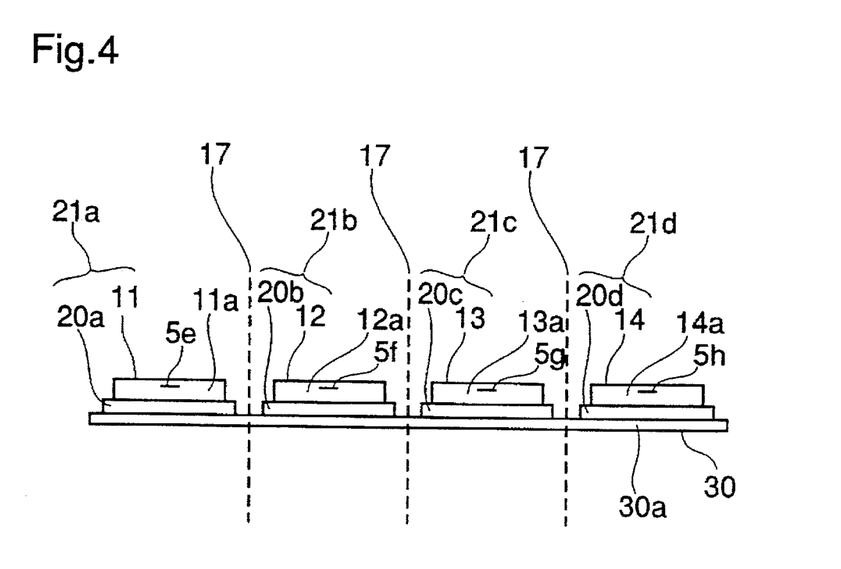
FIG. 4 is a side view illustrating a process step in a method for fabricating the integrated semiconductor laser device shown in FIG. 3.

FIG. 4 is a diagram illustrating a process step in a method of fabricating the integrated semiconductor laser device 300. In FIG. 4, the same reference numerals as in FIG. 3 designate the same or corresponding parts. The printed substrate 30 is bent at locations 17.

Initially, the semiconductor laser elements 21a to 21d are soldered to regions of the upper surface of the printed substrate 30 between the bending positions 17 so that the light emitting facets of the laser chips 11 to 14 are parallel to the side surface 30a of the printed substrate 30. Thereafter, the printed substrate 30 is bent at the bending positions 17 to produce the planar printed substrate 30 having the shape shown in FIG. 3. In FIG. 4, solder used for die-bonding is not shown.

In this third embodiment of the invention, a high-power output semiconductor laser device 300 in which the semiconductor laser elements 21a to 21d are arranged at positions such that laser beams emitted from the semiconductor laser chips 11 to 14 are parallel to each other and partially overlap each other is fabricated with high reproducibility by soldering the laser elements 21a to 21d to regions on the printed substrate 30 and bending the printed substrate 30. In addition, since the soldering of the laser elements 21a to 21d to the regions of the planar printed substrate 30 is very simple, the fabrication process of the laser device 300 is easily automated.

Further, in the integrated semiconductor laser device 300 according to this third embodiment of the invention, unwanted heat generated in the semiconductor laser chips 11 to 14 is conducted through the heat sinks 20a to 20d, respectively, and the solder used for the die-bonding does not contact the active layers exposed at the facets of the laser chips 11 to 14. Therefore, the integrated semiconductor laser device 300 emits high-power output light with high stability for many hours.

While in the third embodiment emphasis has been placed upon an integrated semiconductor laser device including four semiconductor laser elements, the number of semiconductor laser elements is not restricted to four. When a plurality of semiconductor laser elements, other than four, are soldered to a printed substrate and the printed substrate is bent so that the substrate forms, in side view, a polygonal shape with as many laser elements as sides of the polygon, an integrated semiconductor laser device having the same effects as described above is realized.

Embodiment 4

Figure 5:
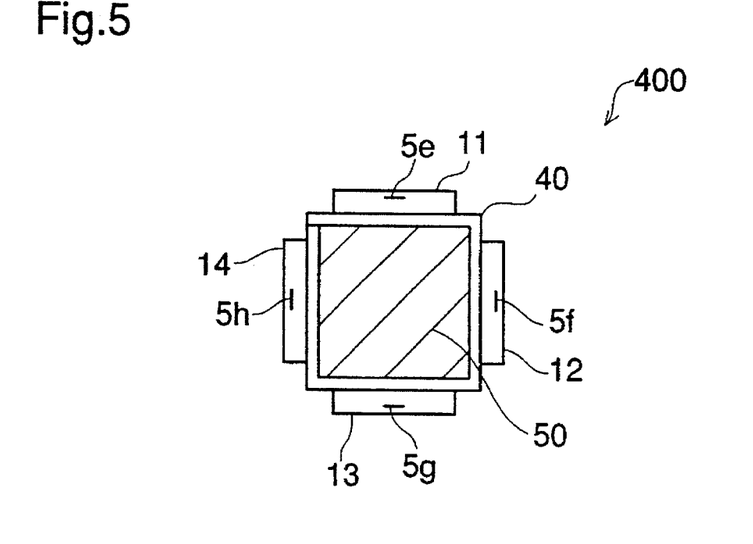
FIG. 5 is a front view illustrating an integrated semiconductor laser device in accordance with a fourth embodiment of the present invention.

FIG. 5 is a diagram illustrating an integrated semiconductor laser device in accordance with a fourth embodiment of the present invention. In the figure, the same reference numerals as in FIG. 1 designate the same or corresponding parts. An integrated semiconductor laser device 400 comprises a square pillar-shaped heat sink 50, a thin metal plate 40 having a high heat conductivity, such as Cu, Au, or Al, and contacting four sides of the heat sink 50, and four semiconductor laser chips 11 to 14 soldered to the surfaces of the thin metal plate 40 opposite respective sides of the heat sink 50. The thin metal plate 40 is tightly adhered to the heat sink 50. The soldering of the laser chips is carried out so that light emitting facets 11a, 12a, 13a, and 14a of the respective semiconductor laser chips 11, 12, 13, and 14 are parallel to a side surface 40a of the thin metal plate 40. In addition, wires (not shown), such as Au wires, are bonded to upper electrodes (not shown) of the semiconductor laser chips 11 to 14, and these upper electrodes are connected to a power supply with the wires. The heat sink 50 is connected to the power supply through wiring (not shown). In FIG. 5, solder used for the die-bonding is not shown.

The operation of the integrated semiconductor laser device 400 is fundamentally identical to the operation of the integrated semiconductor laser device 100 according to the first embodiment. In addition, unwanted heat generated in the semiconductor laser chips 11 to 14 during operation is conducted through the thin metal film 40 and the heat sink 50.

Figure 6:
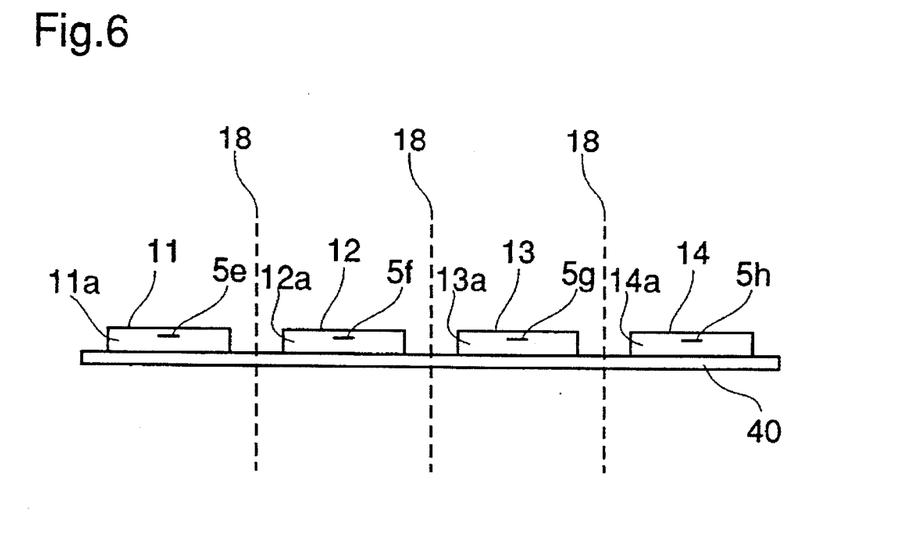
FIG. 6 is a side view illustrating a process step in a method for fabricating the integrated semiconductor laser device shown in FIG. 5.

FIG. 6 is a diagram illustrating a process step in a method of fabricating the integrated semiconductor laser device 400. In FIG. 6, the same reference numerals as in FIG. 5 designate the same or corresponding parts. The thin metal plate 40 is bent at positions 18.

Initially, the semiconductor laser chips 11 to 14 are soldered to regions of the upper surface of the thin metal plate 40 between the bending positions 18 so that the light emitting facets of the laser chips 11 to 14 are parallel to the side surface 40a of the thin metal plate 40. Thereafter, the thin metal plate 40 is wound around the four sides of the square pillar-shaped heat sink 50 so that each bending position 18 of the metal film 40 is applied to one edge of the heat sink 50, followed by bonding of the thin metal plate 40 to the heat sink 50. The bonding of the metal plate 40 to the heat sink 50 is not necessary if the metal plate 40 is in close contact with the heat sink 50 when it is wound around the heat sink 40. In FIG. 6, solder used for the die-bonding is not shown.

In this fourth embodiment of the invention, a high-power output semiconductor laser device 400 in which the semiconductor laser chips 11 to 14 are arranged at positions such that laser beams emitted from the laser chips 11 to 14 are parallel to each other and partially overlap each other is fabricated with high reproducibility by soldering the laser chips 11 to 14 to regions on the thin metal plate 40 and winding the metal plate 40 around the square pillar-shaped heat sink 50. In addition, since the soldering of the laser chips 11 to 14 to the regions of the metal plate 40 is very simple, the fabrication process of the laser device 400 is easily automated.

Further, in the integrated semiconductor laser device 400 according to this fourth embodiment of the invention, unwanted heat generated in the semiconductor laser chips 11 to 14 is conducted through the thin metal plate 40 and the heat sink 50, and the solder used for the die-bonding does not contact the active layers exposed at the facets of the laser chips 11 to 14. Therefore, the integrated semiconductor laser device 400 emits a high-power output light with high stability for many hours.

While in the fourth embodiment emphasis has been placed upon an integrated semiconductor laser device including four semiconductor laser chips, the number of semiconductor laser chips is not restricted to four. When a plurality of semiconductor laser chips, other than four, are soldered to a thin metal plate and the metal plate is wound around a polygonal pillar-shaped heat sink with as many side surfaces as laser chips, an integrated semiconductor laser device having the same effects as described above is realized.

Embodiment 5

Figure 7:
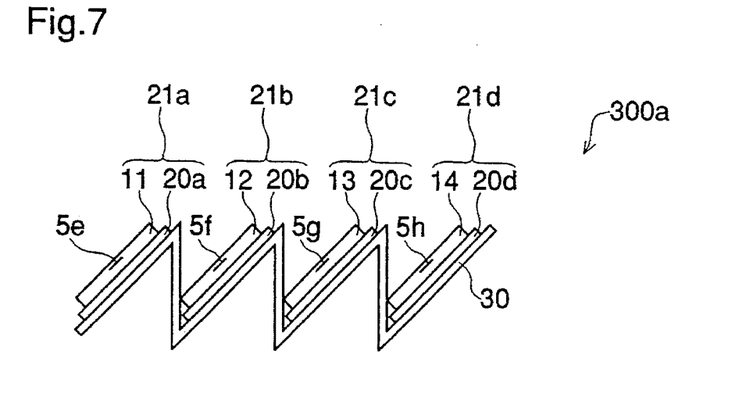
FIG. 7 is a side view illustrating an integrated semiconductor laser device in accordance with a fifth embodiment of the present invention.

FIG. 7 is a side view illustrating an integrated semiconductor laser device in accordance with a fifth embodiment of the present invention. In the figure, the same reference numerals as in FIG. 3 designate the same or corresponding parts. An integrated semiconductor laser device 300a includes a printed substrate 30 having an upper surface with desired wiring (not shown) and bent to form a bellows shape, i.e., having a sawtooth shape in side view. A plurality of semiconductor laser elements 21a to 21d are soldered to inclined portions of the upper surface of the bellows-shaped printed substrate 30. The laser elements 21a to 21d are located at positions such that the light emitting points 5e to 5h of the respective laser elements lie along a straight line.

The fabrication process of the integrated semiconductor laser device 300a is fundamentally identical to the fabrication process of the integrated semiconductor laser device 300 according to the third embodiment except for the mounting positions of the semiconductor laser elements 21a to 21d on the upper surface of the printed substrate 30 and the manner of bending the printed substrate 30.

In this fifth embodiment of the invention, a high-power output semiconductor laser device 300a in which the semiconductor laser elements 21a to 21d are arranged at positions such that the light emitting regions 5e to 5h of the respective laser chips 11 to 14 line along a straight line and laser beams emitted from the respective laser chips 11 to 14 are parallel to each other and partially overlap each other is fabricated with high reproducibility.

Further, in the integrated semiconductor laser device 300a according to this fifth embodiment of the invention, unwanted heat generated in the semiconductor laser chips 11 to 14 is conducted through the heat sinks 20a to 20d, respectively, and the solder used for the die-bonding does not contact the active layers exposed at the facets of the laser chips 11 to 14. Therefore, the integrated semiconductor laser device 300a emits high-power output light with high stability for many hours.

Embodiment 6

Figure 8:
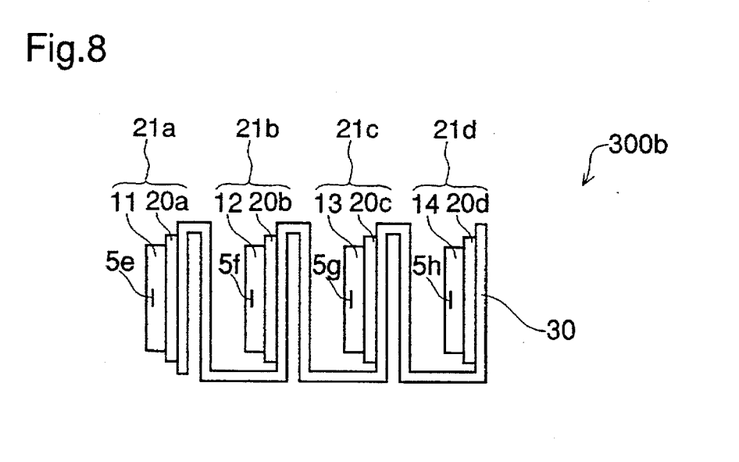
FIG. 8 is a side view illustrating an integrated semiconductor laser device in accordance with a sixth embodiment of the present invention.

FIG. 8 is a side view illustrating an integrated semiconductor laser device in accordance with a sixth embodiment of the present invention. In the figure, the same reference numerals as in FIG. 3 designate the same or corresponding parts. An integrated semiconductor laser device 300b includes a printed substrate 30 having an upper surface with desired wiring (not shown) and bent to form a comb-shape in side view. A plurality of semiconductor laser elements 21a to 21d are soldered to vertical portions of the upper surface of the printed substrate 30. The laser elements 21a to 21d are located at such positions that the light emitting points 5e to 5h of the respective laser elements lie along a straight line.

The fabrication process of the integrated semiconductor laser device 300b is fundamentally identical to the fabricating process of the integrated semiconductor laser device 300 according to the third embodiment except for the mounting positions of the semiconductor laser elements 21a to 21d on the upper surface of the printed substrate 30 and the manner of bending the printed substrate 30.

In this sixth embodiment of the invention, a high-power output semiconductor laser device 300b in which the semiconductor laser elements 21a to 21d are arranged at positions such that the light emitting regions 5e to 5h of the respective laser chips 11 to 14 lie along a straight line and laser beams emitted from the respective laser chips 11 to 14 are parallel to each other and partially overlap each other is fabricated with high reproducibility.

Further, in the integrated semiconductor laser device 300b according to this sixth embodiment of the invention, unwanted heat generated in the semiconductor laser chips 11 to 14 is conducted through the heat sinks 20a to 20d, respectively, and the solder used for the die-bonding does not contact the active layers exposed at the facets of the laser chips 11 to 14. Therefore, the integrated semiconductor laser device 300a emits high-power output light with high stability for many hours.

Embodiment 7

Figure 9:
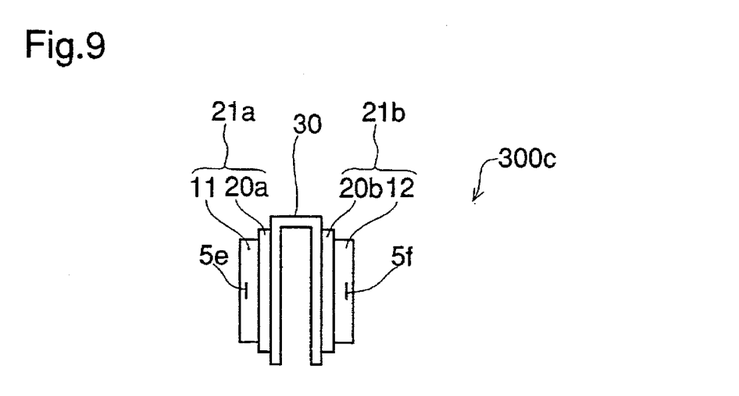
FIG. 9 is a side view illustrating an integrated semiconductor laser device in accordance with a seventh embodiment of the present invention.

While in the third, fifth, and sixth embodiments emphasis has been placed upon an integrated semiconductor laser device including four laser chips or laser elements, an integrated semiconductor laser device according to this seventh embodiment of the invention includes two semiconductor laser elements as shown in FIG. 9.

More specifically, two semiconductor laser elements 21a and 20b are bonded to positions of a printed substrate 30 and, thereafter, the printed substrate 30 is bent so that the upper electrodes (not shown) of the laser chips 11 and 12 are exposed outwardly and the light emitting regions 5e and 5f of the laser chips are close to each other, so that an integrated semiconductor laser device 300c with the same effects as those of the devices according to the third, fifth, and sixth embodiments is obtained.

While in the third, fifth, and sixth embodiments the printed substrate 30 is bent to form the shape of a polygonal pillar or in a sawtooth shape, the manner of bending the printed substrate is not so restricted; that is, a high-power output integrated semiconductor laser device with the same effects as those of the devices according to the third, fifth, and sixth embodiments may be fabricated if the printed substrate 30 is bent so that the average of the distance between adjacent laser chips mounted on the printed substrate 30 is smaller than before the bending.

In the fourth embodiment, the thin metal plate 40 is wound around the four sides of the square pillar-shaped heat sink 50 so that the lower surface of the plate 40 is adhered to the heat sink 50. However, the thin metal plate 40 may be bent to form a desired shape in advance so that the average of the distance between adjacent laser chips mounted on the metal plate 40 is smaller than that before bending and, thereafter, the lower surface, i.e., inner surface, of the bent metal plate is adhered to a heat sink having a shape that fits the inner surface of the metal plate. Also in this case, a high-power output integrated semiconductor laser device as in the fourth embodiment of the invention is obtained.

While in the described embodiments of the invention semiconductor laser chips, each having a single light emitting region, are employed, the present invention may be applied to an integrated semiconductor laser device employing a plurality of semiconductor laser chips that each have more than one light emitting region.

Furthermore, although in the described embodiments solder is employed for die-bonding of semiconductor laser chips or semiconductor laser elements, electrically conductive adhesives may be employed.

What is claimed is:

1. An integrated semiconductor laser device comprising:

a pyramidal heat sink having a plurality of side surfaces; and semiconductor laser chips die-bonded to the side surfaces of the heat sink.

2. An integrated semiconductor laser device comprising:

a pyramidal mount having a plurality of side surfaces; and semiconductor laser elements each element comprising a heat sink plate having opposite upper and lower surfaces and a semiconductor laser chip die-bonded to the upper surface of the heat sink plate, the laser elements being die-bonded to the side surfaces of the mount with the lower surface of the heat sink plate in contact with the mount.

* * * * *